(12) United States Patent
Shin

(10) Patent No.: US 6,862,707 B2
(45) Date of Patent: Mar. 1, 2005

(54) TURBO CODE ENCODER HAVING AN IMPROVED INTERLEAVER

(75) Inventor: Sung-Hyuk Shin, Fort Lee, NJ (US)

(73) Assignee: InterDigital Technology Corporation, Wilmington, DE (US)

(*) Notice: Subject to any disclaimer, the term of this patent is extended or adjusted under 35 U.S.C. 154(b) by 576 days.

(21) Appl. No.: 10/075,545

(22) Filed: Feb. 14, 2002

(65) Prior Publication Data

US 2002/0108084 A1 Aug. 8, 2002

Related U.S. Application Data

(63) Continuation of application No. 09/806,202, filed as application No. PCT/US99/24066 on Oct. 12, 1999.
(60) Provisional application No. 60/112,318, filed on Dec. 14, 1998, and provisional application No. 60/104,040, filed on Oct. 13, 1998.

(51) Int. Cl.[7] .......................... H03M 13/00; G06F 11/00
(52) U.S. Cl. ...................................... 714/786; 714/701
(58) Field of Search ............................... 714/755, 701, 714/702, 786

(56) References Cited

U.S. PATENT DOCUMENTS 6,334,197 B1 * 12/2001 Eroz et al. .................. 714/701

OTHER PUBLICATIONS

Divsalar et al., Turbo codes for PCS applications, 1995, IEEE, p. 54–59.*

Blackert et al., Turbo code termination and interleaver conditions, Nov. 23, 1995, IEEE Elect. Lett. vol. 31, No. 24, p. 2082–2084.*

Barbulescu et al., Terminating the trellis of turbo codes in the same state, Jan. 5, 1995, IEEE, Elect. Lett., vol. 31, No. 1, p. 22–23.*

Olsen, D, A hybrid interleaving scheme that enables packet switching on multiple–access radion communication channels, Dec. 1999, IEEE Trans. on Comm., vol. 47, No. 12, p. 1777–1780.*

Wang et al., On the performance of turbo codes, 1998, IEEE, p. 987–992.*

* cited by examiner

*Primary Examiner*—Shelly A Chase
(74) *Attorney, Agent, or Firm*—Volpe and Koenig, PC

(57) ABSTRACT

A turbo code encoder with an interleaver having two recursive systematic constituent code (RSC) encoders. The encoder encodes a finite sequence of informative bits without requiring a plurality of tail bits to flush the registers of each encoder to an all-zero state. The interleaver reduces the turbo code overhead by using only a single tail bit sequence. The interleaver also selectively reorders integers in accordance with a predefined set of rules.

13 Claims, 11 Drawing Sheets

TURBO CODE ENCODER HAVING AN IMPROVED INTERLEAVER

CROSS REFERENCE TO RELATED APPLICATIONS

This application is a continuation of application Ser. No. 09/806,202, filed Mar. 27, 2001 which is a Section 371 National Phase of PCT/US99/24066, filed Oct. 12, 1999 which claims priority from Provisional Application No. 60/112,318, filed Dec. 14, 1998 and Provisional Application No. 60/104,040, filed Oct. 13, 1998.

BACKGROUND OF THE INVENTION

1. Field of the Invention

The present invention relates generally to processes that create time diversity in systems with high processing gain. More specifically, the invention relates to a system and method of turbo code interleaving mapping where the number of tail bits required to flush the storage registers of each constituent encoder to an all-zero state are reduced.

2. Description of the Prior Art

In many types of data communication systems, whether voice or non-voice, signal diversity or redundancy when transmitting information is shown to improve performance without compromising other aspects of the data transmission system. Two techniques that add time diversity are known as interleaving and forward error-correcting (FEC) coding.

The process of interleaving is where the input data sequence is permuted or reordered into another sequence. For example:

$$(0\ 1\ 2\ 3\ 4\ 5\ 6\ 7) \xleftarrow{I_N} (3\ 0\ 6\ 7\ 1\ 5\ 2\ 4)$$

where the mathematical operator $I_N[J]$ transposes the original position of each bit or symbol of a finite input sequence to a new position J by operation of the interleaver $I_N$. This reordering process that achieves time diversity is called interleaving and can be performed in a number of ways. Two methods of typical interleaving are known as block and random interleaving.

At the transmission destination, the signal is again reordered, putting the data sequence back in the original order. The inverse process is called deinterleaving.

The most recent advance in coding techniques which exhibit the best performance are turbo codes. A variety of turbo code interleaver designs exist and require less complexity when decoding. The three most popular are: 1) block interleavers; 2) pseudo-random interleavers; and 3) S-random interleavers.

The best performing interleavers are the S-random interleavers. The S-random interleavers exploit the property of not mapping neighbor positions within a certain sequence length, to neighbor positions exhibiting the same length. This makes the sequence length as large as possible. All interleaver designs require a specific set of rules setting forth input sequence size and permutation.

In conjunction with interleaving, FEC coding improves performance for signals that are coherently demodulated. FEC coding adds additional redundancy in the original data sequence. In communication systems that communicate over a spread spectrum air interface, redundancy is already present in the shared spectral transmission channel. A FEC encoder is a finite-state machine that relies upon nodes or states and delay registers. The predetermined transitions between the registers define a path from which a given data input may produce an output. A common way to illustrate the encoding and decoding technique for the convolutionally encoded data is the use of a trellis diagram which is known to those familiar with this art. A trellis diagram is an infinite replication of a state machine diagram and is shown in FIG. 1.

The decoding is typically performed using a maximum likelihood algorithm which relies upon the trellis structure and the path state or metric for each level and each selected node or state. Any code word of a convolutional code corresponds to the symbols along a path in the trellis diagram. At each state and at each level of the trellis an add-compare-select operation is performed to select the best path and state. The trellis is assembled over many received symbols. After a predefined number of symbols have been accumulated, the determination finds the trellis path with the smallest error. The final decision on all bits in the trellis is made via the encoders by forcing the encoder to return to an initial all-zero state. This is achieved by inserting zero tail bits at the end of the finite bit stream after encoding. This process is referred to as "tailing off."

A process known as "chaining back" is performed starting at the last node, tracing the decision path back from the last decision to the first. This method of decoding determines which symbol was originally sent. The trellis structure introduces redundancy and accumulates past history.

A prior art turbo encoder is shown in FIG. 2. The encoder comprises first and second systematic recursive convolutional code (RCS) encoders coupled in parallel with a turbo code interleaver coupled prior to the second recursive convolutional encoder. The two recursive convolutional codes used in each encoder are known as the constituent codes.

The first encoder reorders the input information bits $\vec{x}_N$ in their original order while the second encoder reorders the input bits as permuted by the turbo code interleaver $\vec{x}'_N$. The input information sequence $\vec{x}_N$ is always transmitted through a channel. In dependence upon the data transmission rate, the outputs from both encoders may be "punctured" before transmission $\vec{y}_N$. Puncturing is a process where alternate outputs of the lower taps (first and second encoders $\vec{p}^1_N$, $\vec{p}^2_N$) are deleted from the output. This process establishes a code rate.

The turbo code interleaver is a scrambler defined by a permutation of the sequence length with no repetitions. A complete sequence is input into the interleaver and output in a predefined order.

A prior art tailing off process is shown and described in FIGS. 3 and 4. The tail bits for each encoder are obtained from register feedback from each respective encoder as shown in FIG. 3. Since the register contents of each constituent encoder are different at the beginning of the tailing off operation, each encoder must be flushed separately. As described in FIG. 4, each encoder (in FIG. 3) is flushed independently and exclusive of each other after the information bits have been encoded. Each encoder derives and receives its own tail bits. Therefore, if m equals the number of states or register memory of an encoder, m tail bits are required for one encoder and 2 m are required for both encoders.

A prior art turbo code decoder is shown in FIG. 5. On receiving the demodulated soft value signal $\vec{y}_N$, the soft-decision information for the systematic (information) and parity bits $\vec{p}^1_N$ from the first constituent encoder are input to a first constituent decoder. The first constituent decoder generates updated, soft-decision likelihood values $\vec{L}_{e_1}(\vec{x}_N)$ for the information bits that are input along with the information bits to a decoder interleaver. The input to a second constituent decoder includes the interleaved soft-valued sequences $\vec{x}'_N$ and $\vec{L}'_{e_1}(\vec{x}_N)$ and the parity bits $\vec{p}^2_N$ from the second constituent encoder. The output of the second decoder improves on the soft-decision likelihood values derived from the output from the first constituent decoder and is fed back to the first constituent decoder after reordering in accordance with the turbo decoder interleaver as an iterative process. The output $\vec{x}^e$ from the second constituent decoder is obtained after the decoding operation is completed.

As discussed above, the use of a turbo code interleaver requires that coding be performed on a finite sequence length. To encode such a finite information sequence, it is necessary for both constituent RSC encoders in the turbo encoder to start and end in an all zero-state with the same trellis bits. Most prior art turbo encoders have their information sequences terminated with a plurality of tail bits. Tail bits are considered a nuisance and as overhead of the turbo encoded sequence.

The difficulties with flushing turbo code encoders and bringing their trellises back to their initial state have long been recognized by the prior art. For example, the article entitled Turbo Code Termination And Interleaver Conditions by Blackert et al., the article entitled Turbo Codes For PSC Applications by Divsalar et al., and the article entitled Terminating The Trellis Of Turbo-Codes In The Same State by Barbulescu et al. recognize the problems inherent in bringing the trellises of multiple encoders back to their initial states. However, none of these prior art solutions provide a suitable method for bringing the trellises of multiple encoders back to their initial state without reduction in the efficiency of the encoder.

Accordingly, there exists a need for a turbo code interleaver that does not require a plurality of tail bits to force each constituent encoder to an all-zero state.

SUMMARY OF THE INVENTION

The present invention relates to a turbo code hybrid interleaver having recursive systematic constituent encoders. The system and process encodes a finite frame of bits without requiring a plurality of tail bits to flush the registers of each encoder to an all-zero state. The hybrid interleaver reduces the turbo code overhead by using the same tail bits for both constituent encoders improving the performance of the best turbo interleaver.

Accordingly, it is an object of the present invention to provide a system and method of interleaving that does not require a plurality tail bits to be part of the encoding process.

It is a further object of the invention to eliminate the unnecessary overhead in the turbo code encoding sequence limiting the number of tail bits that terminate the encoding process to an all-zero state with a single m-bit tail where m is the number of storage registers in each constituent encoder.

Other objects and advantages of the system and the method will become apparent to those skilled in the art after reading the detailed description of the preferred embodiment.

DETAILED DESCRIPTION OF THE PREFERRED EMBODIMENTS

Figure 6:
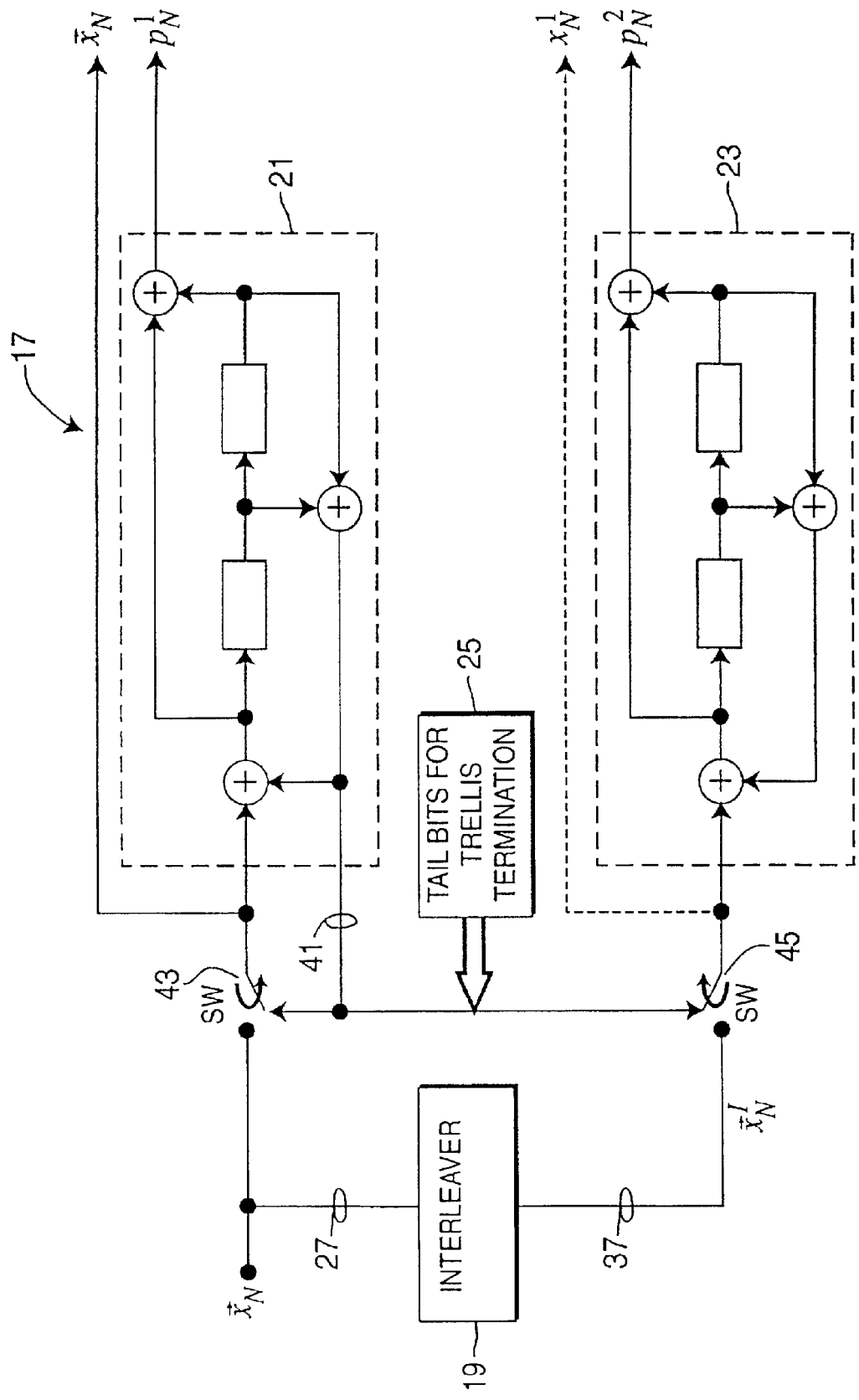
FIG. 6 is a system diagram of a turbo code encoder with a hybrid interleaver employing the system and method of the present invention.

A turbo code encoder 17 with a hybrid interleaver 19 taught in accordance with the present invention as shown in FIG. 6 terminates the first 21 and second 23 RCS constituent encoders to an all-zero state using a single tailing off bit operation 25. The present invention 17 exploits the cyclic property of each constituent encoder 21, 23 in conjunction with keeping the performance of the best turbo interleavers. The turbo code encoder 17 with hybrid interleaver 19 reduces additional tail bit overhead necessary for trellis termination of each constituent encoder 21, 23.

Figure 7:
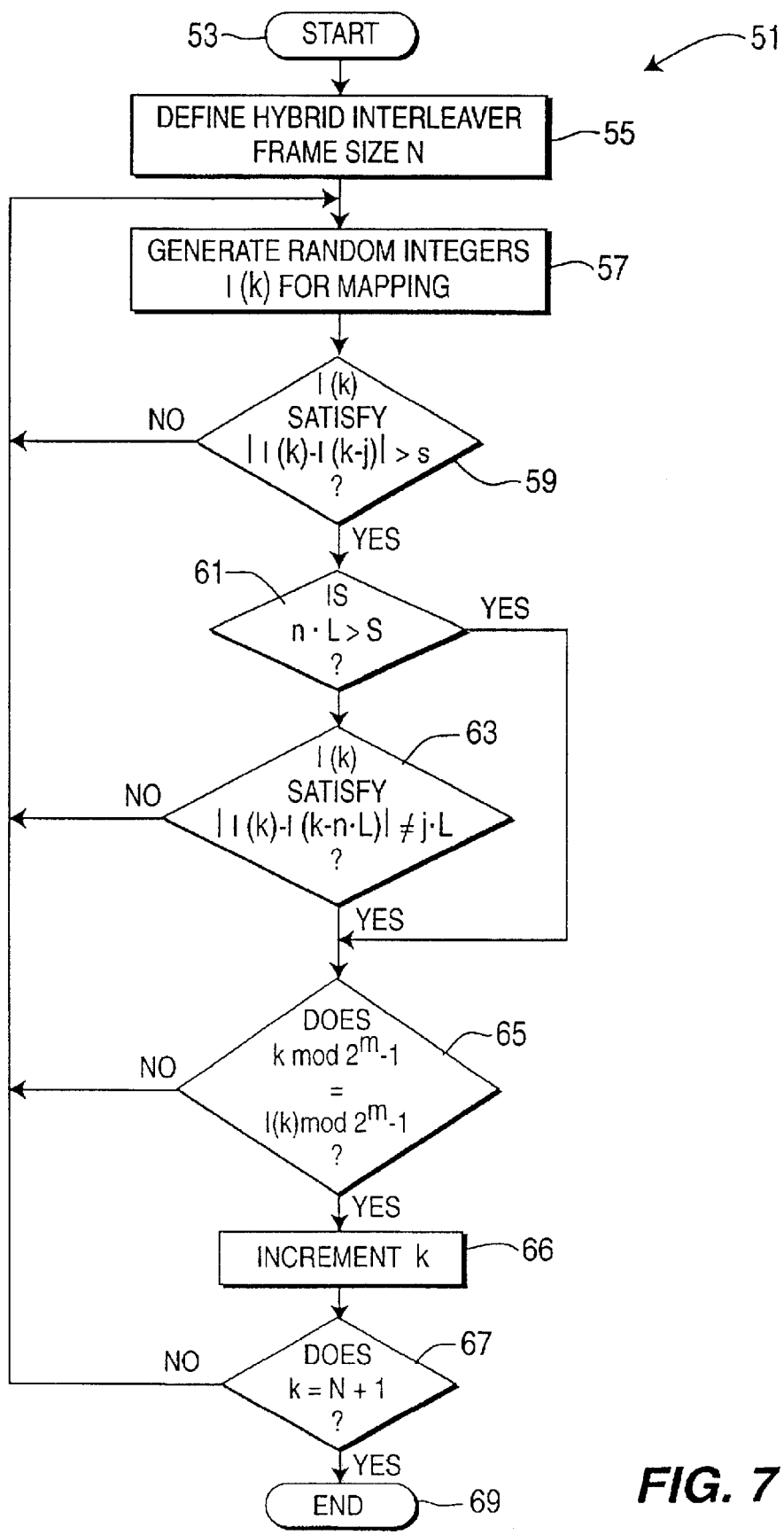
FIG. 7 is a flowchart of the interleaver method embodying the present invention.

FIGS. 6 and 7, describe the system and process of the hybrid turbo code interleaver 19. The process 51 begins (step 53) by receiving a sequence of input data 27 for encoding. The encoding sequence frame size N is chosen (step 55). The state size and puncturing rate (code rate) are independent of the hybrid interleaver 19. The hybrid interleaver 19 generates the random integers I(k) for permutation (step 57).

Figure 8:
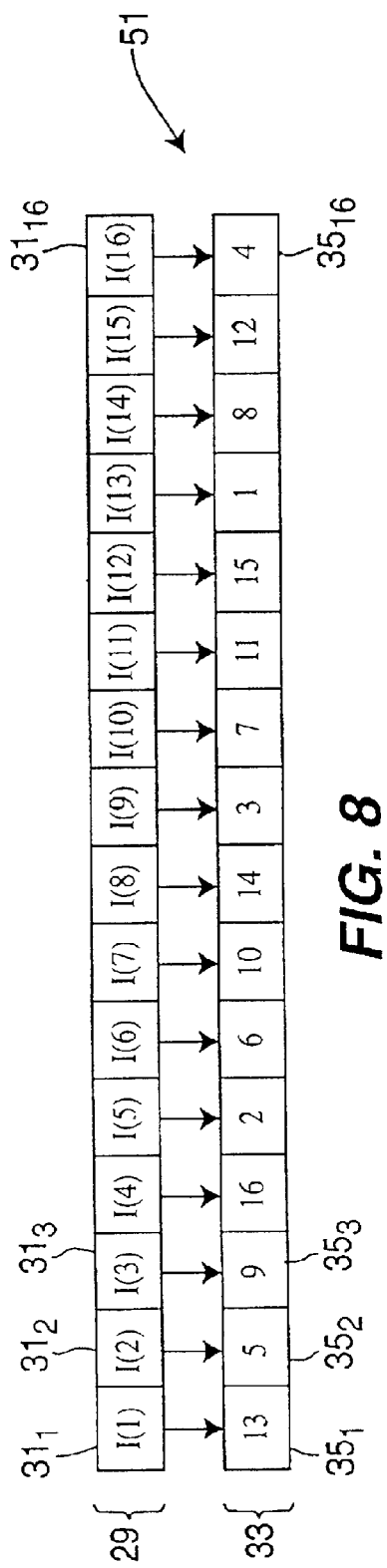
FIG. 8 is a 16 frame size interleaving sequence produced by the present invention for a 4 state turbo code encoder with S equal to 2 and L equal to 4.
Figure 9:
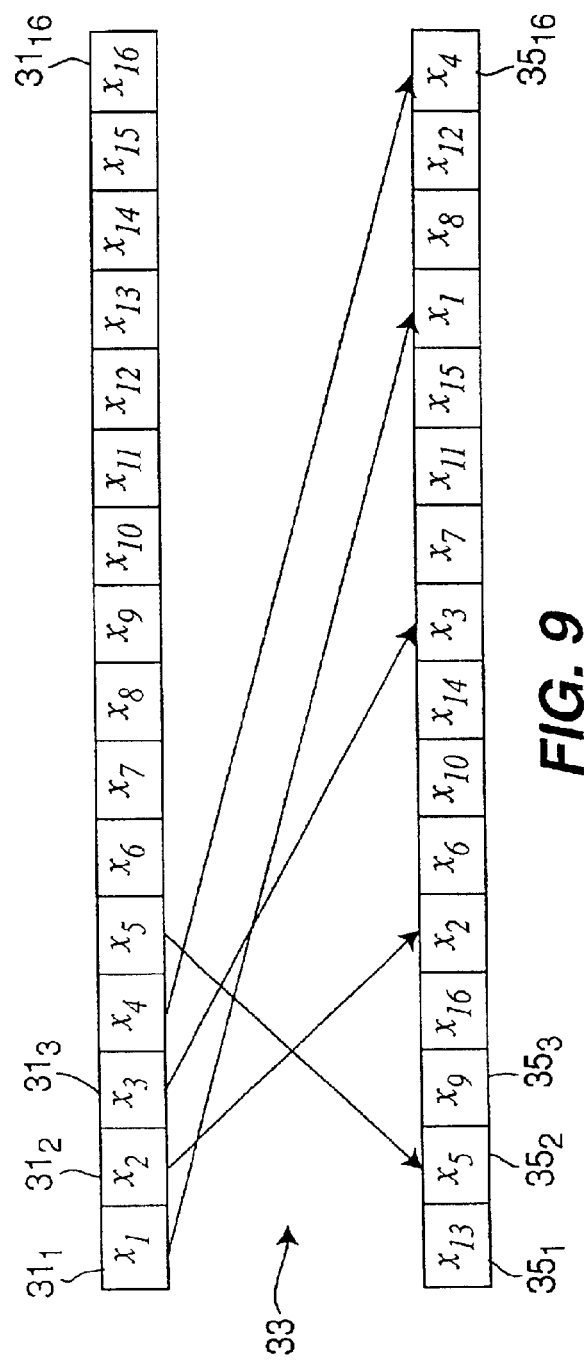
FIG. 9 is the mapping of the interleaving sequence of FIG. 8.

As shown in FIGS. 8 and 9, the generation of the random integer sequence is performed bit by bit for each frame 29 position $31_{1-N}$. The generation of a random integer (step 57) denoted as I(k) is:

$$1 \leq I(k) \leq N \qquad \text{Equation (1)}$$

where k=1,2, . . . ,N for each mapped 33 position $35_{1-N}$ in the interleaver sequence. The current selection, I(k) must meet conditions A (step 59), B (step 63) and C (step 65) as follows.

$$\text{Condition } A: |I(k)-I(k-j)| > S \qquad \text{Equation (2)}$$

where $$0 < j \leq S \qquad \text{Equation (3)}$$

and $$k-j \geq 0. \qquad \text{Equation (4)}$$

Condition A Equation (2) represents the properties of S-random interleavers. S is an arbitrary value.

$$\text{Condition } B: |I(k)-I(k-n \cdot L)| \neq j \cdot L \qquad \text{Equation (5)}$$

(step 63) where n and j are positive integers subject to:

$$k-n \cdot L \geq 0; \qquad \text{Equation (6)}$$

;and $$n \cdot L \geq S \qquad \text{Equation (7)}$$

(step 61)

L is determined by the constituent encoder used in the turbo code encoder. As an example, L=7 is used in an eight state turbo encoder.

$$\text{Condition } C{:}k \bmod 2^m-1 = I(k) \bmod 2^m-1 \forall k \qquad \text{Equation (9)}$$

(step 65) where m is the size of memory in the constituent encoder. For 4 and 8 state encoders, m equals 2 and 3 respectively. The above steps are repeated until all of the integers, I(k) for k=1,2, . . . ,N, (step 66) for the hybrid interleaver 19 are selected (step 67) and output (step 69).

Figure 10:
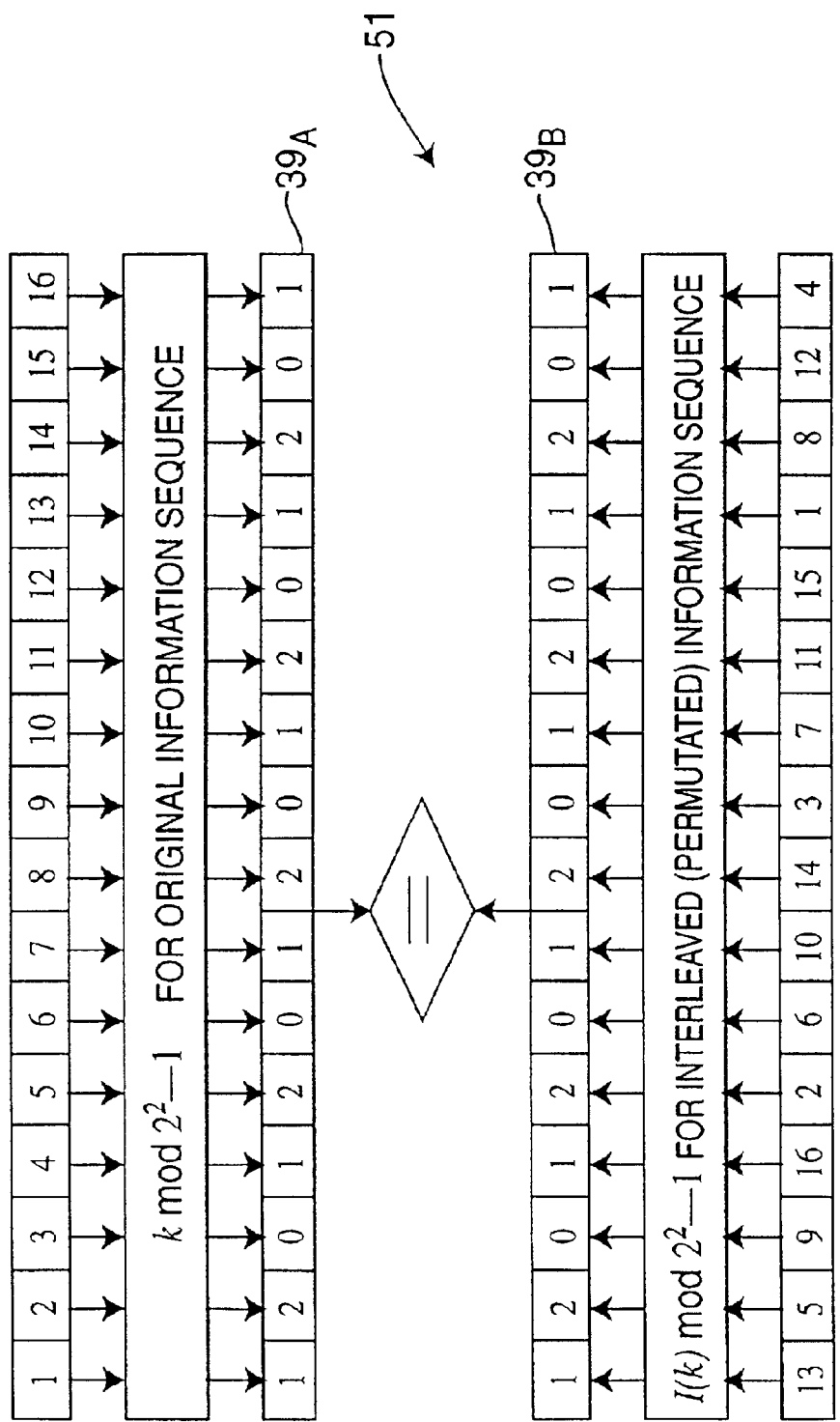
FIG. 10 is the 16 frame size interleaving sequence of FIG. 8 verified.

An example of the above system and method is shown in FIGS. 8, 9 and 10. A sequence frame size of 16 using a 4 state turbo code encoder 17 with hybrid interleaver 19 with S equal to 2 and L equal to 4 is shown permuted in accordance with the teachings of the invention. The hybrid interleaver 19 satisfies Conditions A and B. The hybrid interleaver 19 output 37 is verified in FIG. 10 using Condition C such that after dividing the index of an input 27 information sequence by $2^m-1$, the resulting remainder sequence 39A is equal to the corresponding remainder sequence 39B due to the interleaving mapping index 33. Once the turbo code hybrid interleaver 19 is specified 51, the information bits 27 are permuted according the hybrid interleaver 19 in order for the second 23 constituent encoder to receive the output 37.

Figure 1:
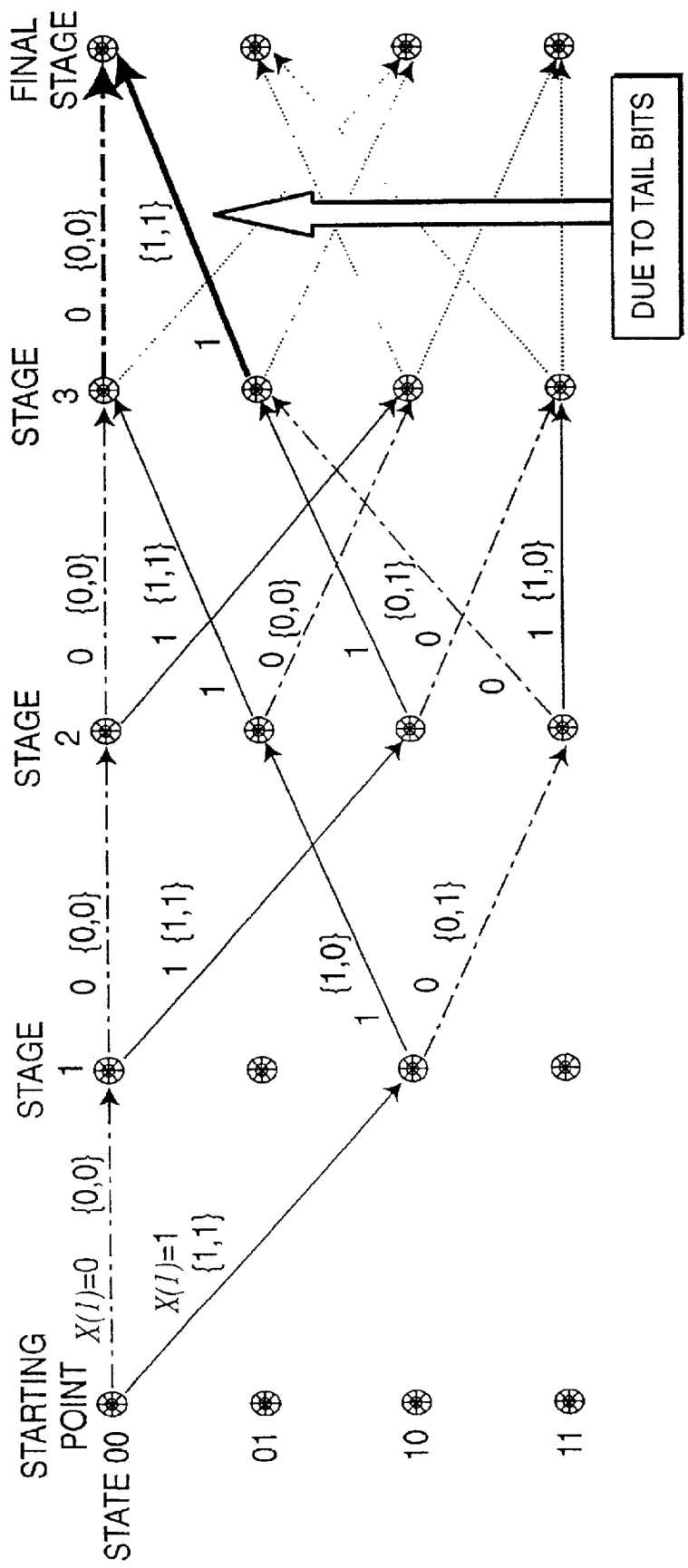
FIG. 1 is a prior art trellis diagram for a 4 state RSC encoder.
Figure 2:
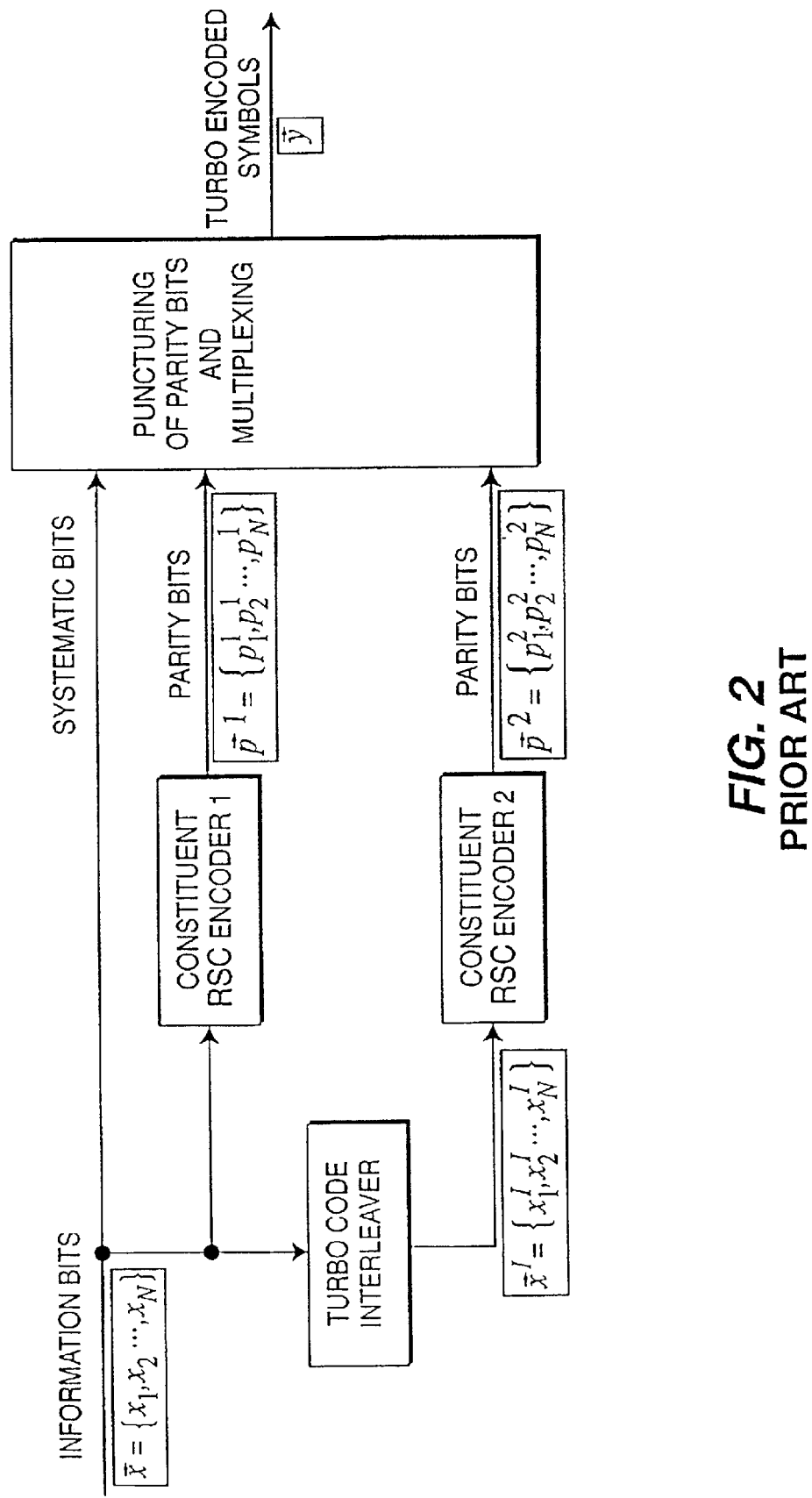
FIG. 2 is a system diagram of a prior art, turbo code encoder.
Figure 3:
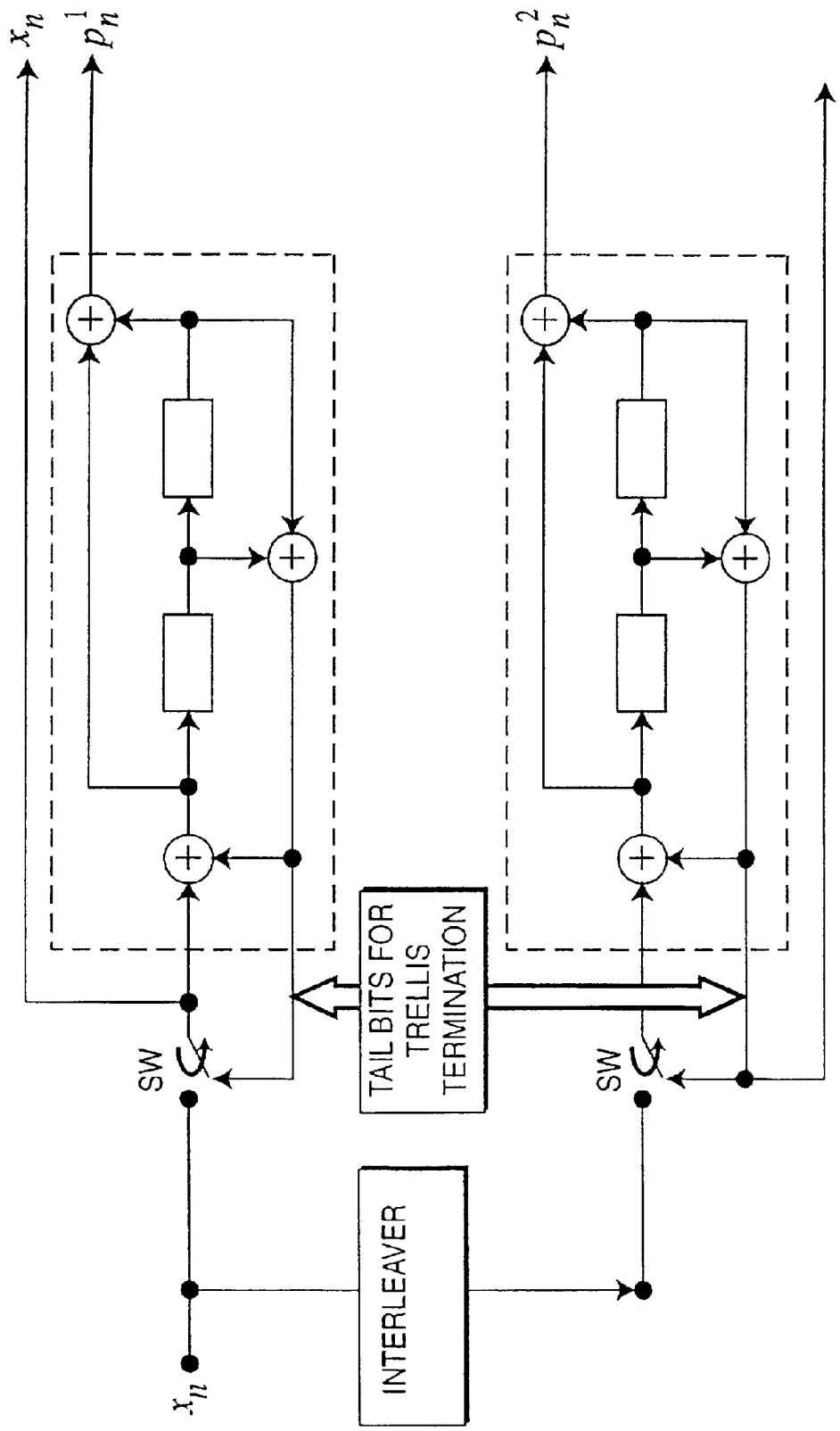
FIG. 3 is a system diagram of a prior art, four state encoder showing tailing off.
Figure 4:
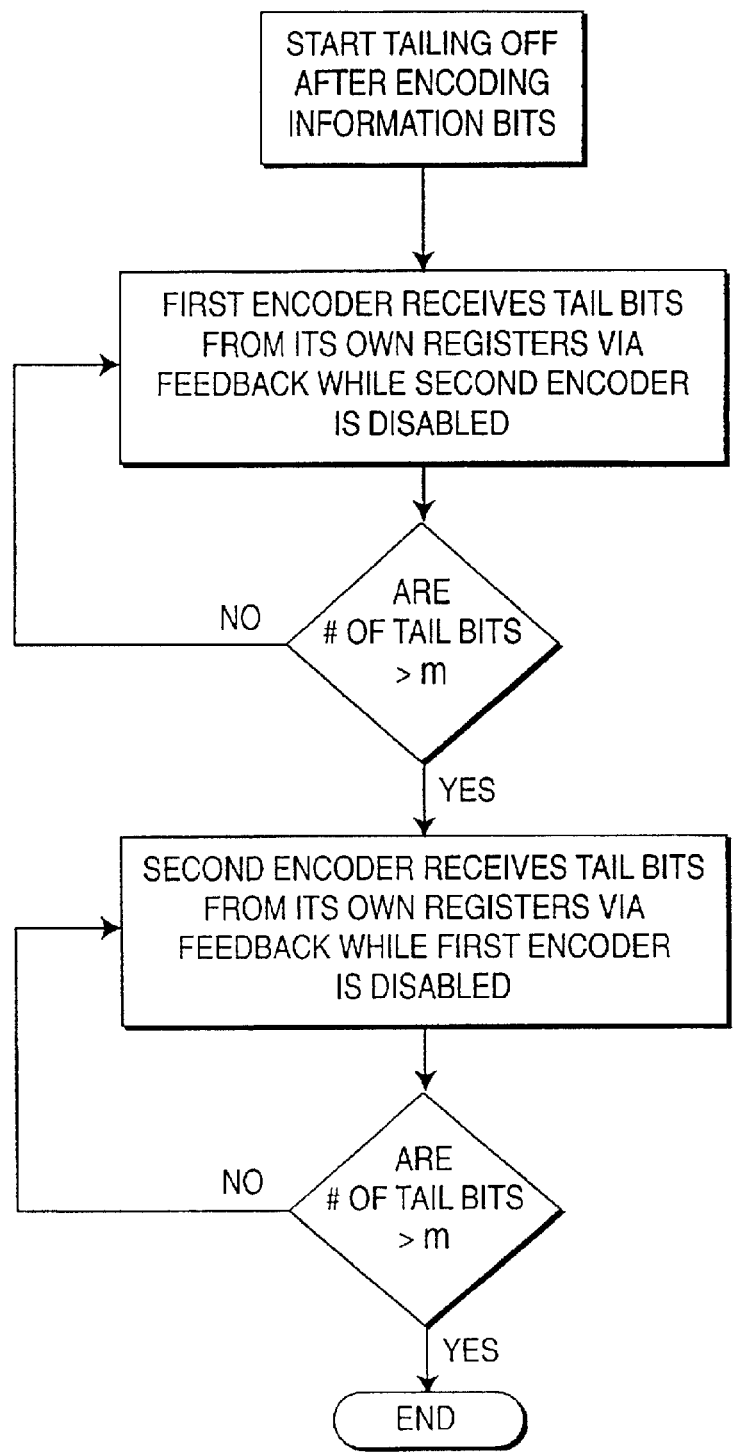
FIG. 4 is a flowchart of a prior art method of tailing off.
Figure 11:
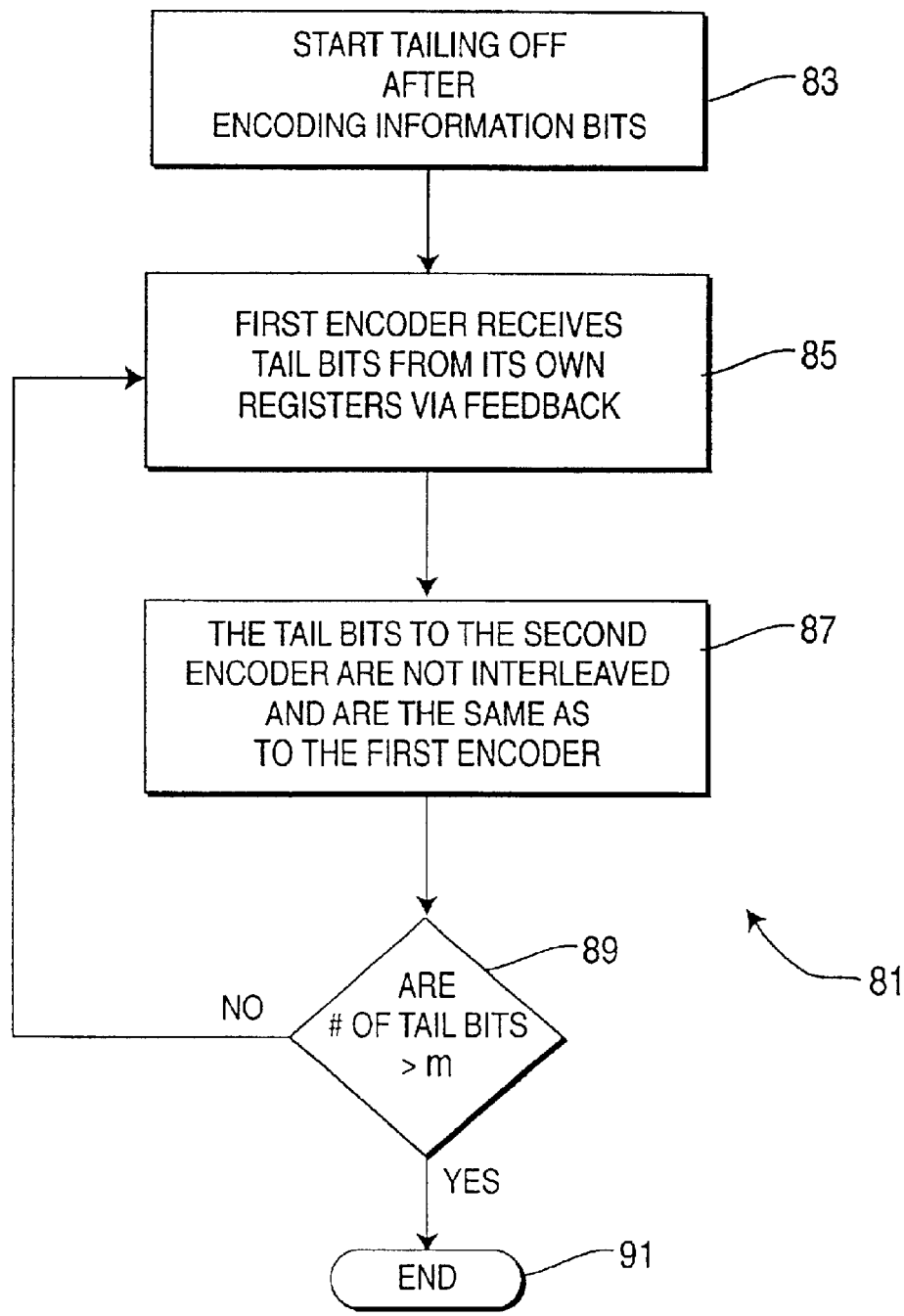
FIG. 11 is a flowchart of the tailing off method embodying the present invention.

The process of the present invention that terminates the trellis using the same tail bits for the first 21 and second 23 constituent encoders is shown and described in FIGS. 6 and 11. As described above, the information bits are encoded by both encoders. The first 21 constituent encoder operates on the information bits 27 in their original order. The second 23 constituent encoder operates on the information bits 27 as permuted 37 according to the hybrid interleaver 19. The output from the first 21 and second 23 constituent encoders are punctured and multiplexed producing an output (see FIG. 2).

The trellis termination process 81 using the same tail bits for both constituent encoders starts (step 83) with acknowledging that all of the information bits have been encoded by the first 21 and second 23 constituent encoders. At this time in the encoding process, the register contents of both encoders are the same. The first 21 and second 23 encoders switch inputs from the original information 27 and permuted 37 bit streams to feedback 41 from the first 21 encoder. The puncturing of the first 21 encoder output $\vec{p}^1{}_N$ and the second 23 output $\vec{p}^2{}_N$ with the information output $\vec{x}_N$ for the tailing off process is the same as during the encoding 21, 23 of the information bits 27, 37. After both switches 43, 45 transition, the first 21 encoder receives tail bits from its own register via the feedback 41 (step 85). The tail bits to the second 23 encoder have not been interleaved by the hybrid interleaver 19 and are the same tail bits 41 for trellis termination as in the first 21 encoder (step 87).

For a M state encoder, $\log_2 M$ tail bits are required to flush all of the registers in the first 21 and second 23 encoders to an all-zero state. With L=$\log_2 M$, Table 1 shows the required number of tail bits and the total number of tail coded symbols for a 4 and 8 state encoder.

TABLE 1

| | | L | Total coded bits at tail part (prior art) | Total coded bits at tail part (present invention) |
|---|---|---|---|---|
| 8-state encoder | ½ rate Turbo code | 3 | 2 × 6 = 12 | 6 |
| | ⅓ rate Turbo code | 3 | 2 × 9 = 18 | 9 |

TABLE 1-continued

| | | L | Total coded bits at tail part (prior art) | Total coded bits at tail part (present invention) |
|---|---|---|---|---|
| 4-state encoder | ½ rate Turbo code | 2 | 2 × 4 = 8 | 4 |
| | ⅓ rate Turbo code | 2 | 2 × 6 = 12 | 6 |

For a ½ rate and ⅓ rate turbo code encoder with four (4) state constituent encoders, the present invention 17 eliminates 4 and 6 tail bits, respectively. For a ½ rate and ⅓ rate turbo code encoder with eight (8) state constituent encoders, the present invention 17 eliminates 6 and 9 tail bits, respectively, as compared to and required by the prior art.

Figure 5:
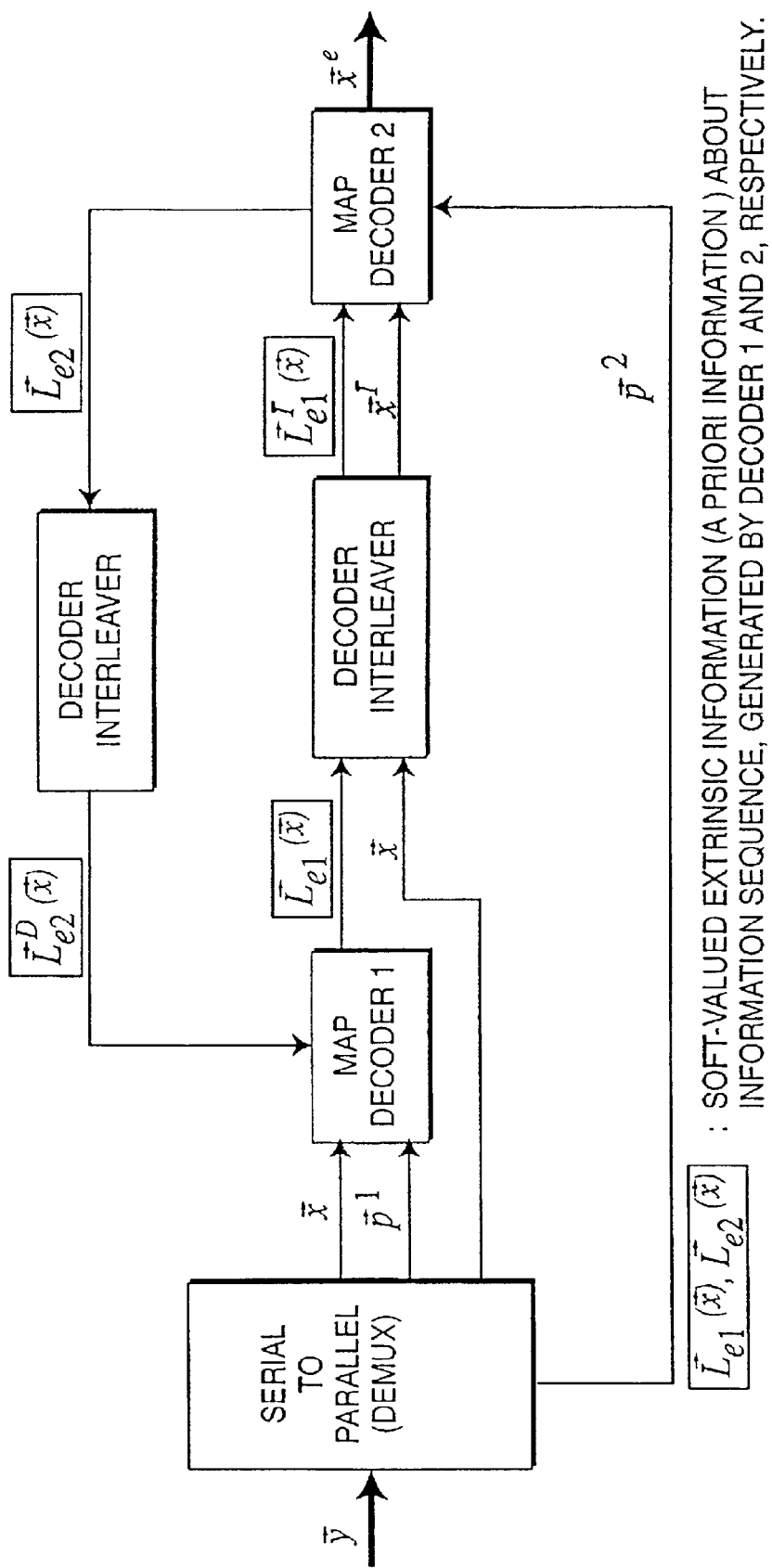
FIG. 5 is a system diagram of a prior art, turbo code decoder.

The turbo code encoder with the hybrid interleaver yields better performance than prior art S-random interleavers since the rules stated in Condition B avoids worst case low weight distribution of the turbo codes while Condition A retains the best characteristics. Since the hybrid interleaver 19 leads to the same trellis state sequences for both the first 21 and second 23 constituent decoders at the beginning of the tail part, the use of a single m-bit tail sequence to flush both the first 21 and second 23 encoders to an all-zero state is acceptable. The extrinsic information $\vec{L}^1{}_{e1}$ including tail bits generated from the first constituent decoder are passed on to the second constituent decoder which increases to overall performance (see FIG. 5). As an example, if the original information sequence is $\vec{x}_N$={1 0 1 1 0 1 0 0 0 1 1 1 0 1 0 1}.

The permuted information sequence according to the hybrid interleaver 19 is $\vec{x}'_N$={0 0 0 1 0 1 1 1 1 0 1 0 1 0 1 1}.

The information sequence is encoded by the first 21 and second 23 constituent encoders. The first 21 constituent encoder operates on the input $\vec{x}$ in its original order, while the second 23 constituent encoder operates on the permuted $\vec{x}'$ interleaver 19 output.

The trellis state sequence obtained from the first 21 encoder is

{2 3 3 3 1 0 0 0 0 2 1 0 0 2 3 3 1 0}.

The trellis state sequence obtained from the second 23 encoder is

{0 0 0 2 3 3 3 3 3 1 0 0 2 3 3 3 1 0}.

As shown above, the last two states (four bits) from each trellis state sequence are the same due to the hybrid interleaver 19. This allows the first 21 and the second 23 constituent encoders to receive the same tail bits leading to the reduced overhead of the turbo coding process.

Condition C leads the trellis state of two constituent encoders to be the same after encoding information bits. This allows the same tail bits for both constituent encoders, resulting in the reduction of turbo-code overhead due to tail bits. In addition, using the same tail bits is desirable for an interative decoder as previously explained in which the interleaver design was based on a S-random interleaver. While the present invention improves turbo-code performance, its memory requirement is the same as for the S-random interleaver with the memory storage requirement proportional to the interleaver size.

Figure 12:
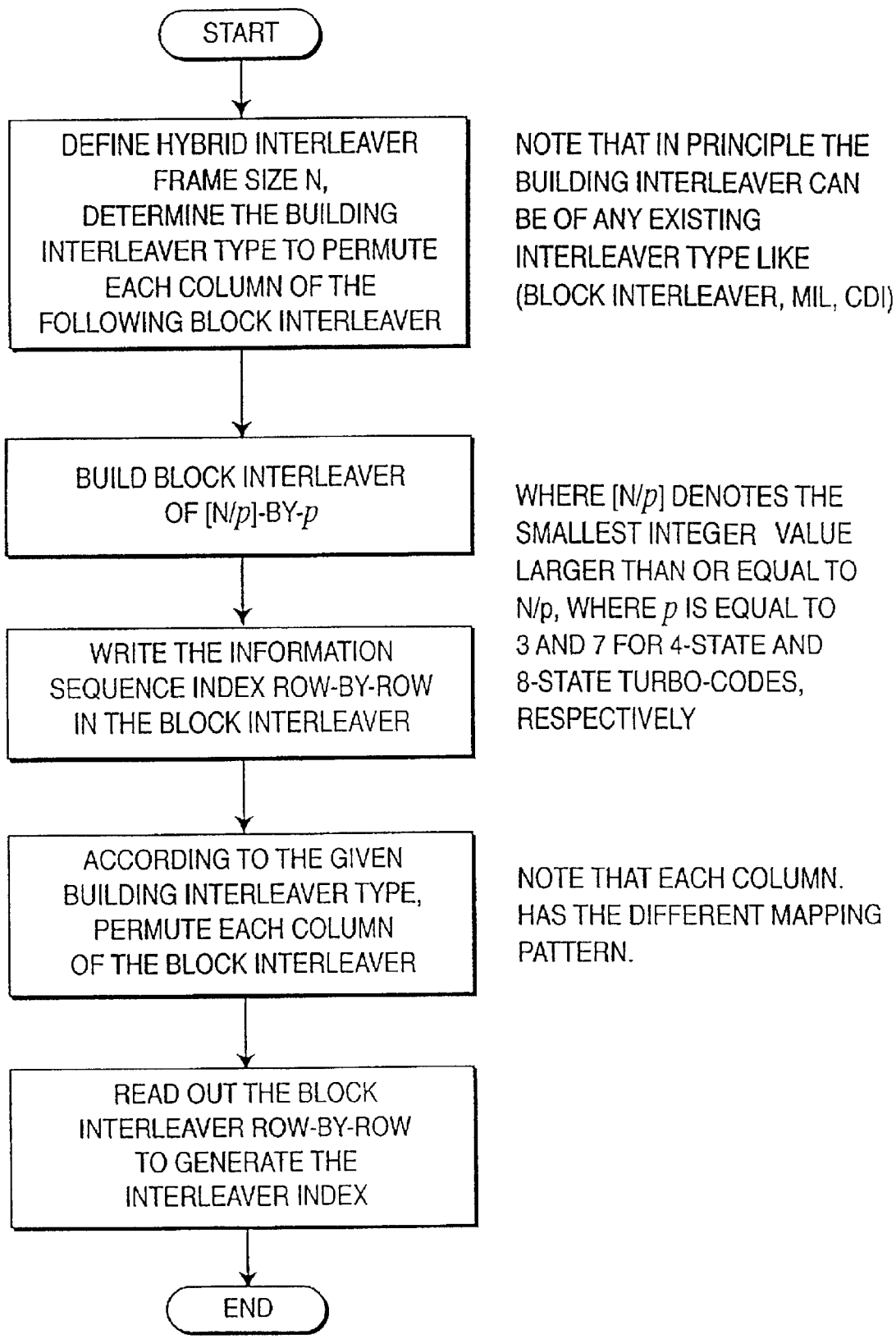
FIG. 12 is a flowchart of an alternative embodiment.

An alternative embodiment is described in FIG. 12.

Let D denote the information sequence of binary bits with block size N such that:

$$D=\{d_1, d_2, \ldots, d_N\} \text{ where } d_k=\pm 1 \qquad \text{Equation (10)}$$

Given a M-state turbo-coder where M is equal to 4 or 8, we can partition the information sequence, D, into p-disjoint subsets, S, where p=M-1 as follows:

$S_0=\{d_k|k \bmod p=0\}$    Equation (11)

$S_1=\{d_k|k \bmod p=1\}$    Equation (12)

.
.
.

$S_{p-1}=\{d_k|k \bmod p=p-1\}$    Equation (13)

where p is set to be 3 and 7 for 4-state and 8-state turbo codes, respectively. The above partition method is similar to the above coset partitioning. The value of p for each state Turbo-code is specified.

Each subset has the block size of $\lfloor N/p \rfloor$ where $\lfloor N/p \rfloor$ denotes the smallest integer value larger than or equal to N/p. Each subset is permuted by the use of any interleaver mapping. Then we combine all the individual subsets in order to obtain the entire interleaver output, denoted as I, as follows:

```
Count=0;
for k=1: Block size of subset
    for i= 1: P
        if i=p
    I(count)= S₀(k)
        else
            I(count)= Sᵢ(k)
        end if
    count = count + 1
    if count =N
    exit
        end
end
``` where $S_i(k)$ is the $k^{th}$ interleaved output bit of the subset $S_i$ and $S_0(k)$ is the $k^{th}$ interleaved output bit of the subset $S_0$. The above mentioned procedures including partition and combining subsets can be re-illustrated by using a block interleaver with $\lfloor N/p \rfloor$ rows and p columns as follows:

1) The information bits are stored row-wise in the block interleaver as follows:
Write

| $d_1$ | $d_2$ | $d_3$ | ... | $d_p$ |
|---|---|---|---|---|
| $d_{p+1}$ | $d_{p+2}$ | $d_{p+3}$ | ... | $d_{2p}$ |
| $d_{2p+1}$ | $d_{2p+2}$ | $d_{2p+3}$ | ... | $d_{3p}$ |
| $d_{3p+1}$ | $d_{3p+2}$ | $d_{3p+3}$ | ... | $d_{4p}$ |
| . | . | . | ... | . |
| . | . | . | ... | . |
| . | . | . | ... | . |
| $d_{N/p+1}$ | $d_{N/p+2}$ | $d_{N/p+3}$ | ... | $d_{N/p+p}$ |
| ⇑ | ⇑ | ⇑ |  | ⇑ |
| $S_1$ | $S_2$ | $S_3$ |  | $S_0$ |

2) Permute the bits within each column block according to the given interleaver type, which can be, in principle, one of any candidate interleavers. For example, applying conditions A and B to each column block; condition C is not necessary under these circumstances.

3) Read out the matrix row-by-row in order as shown below to drive the second constituent, whose input is the interleaved output sequence, to the same state as without interleaving the original information sequence.

Read

| $d_{N/p}+1$ | $d_{N/p+2}$ | $d_{N/p+3}$ | ... | $d_{N/p+p}$ |
|---|---|---|---|---|
| $d_{3p+1}$ | $d_{3p+2}$ | $d_{3p+3}$ | ... | $d_{4p}$ |
| $d_{2p+1}$ | $d_{2p+2}$ | $d_{2p+3}$ | ... | $d_{3p}$ |
| . | . | . | ... | . |
| . | . | . | ... | . |
| . | . | . | ... | . |
| $d_{p+1}$ | $d_{p+2}$ | $d_{p+3}$ | ... | $d_{2p}$ |
| $d_1$ | $d_2$ | $d_3$ | ... | $d_p$ |
| ⇑ | ⇑ | ⇑ |  | ⇑ |
| $S_1$ | $S_2$ | $S_3$ |  | $S_0$ |

While the present invention has been described in terms of the preferred embodiment, other variations which are in the scope of the invention as outlined in the claims below will be apparent to those skilled in the art.

What is claimed is:

1. A turbo code encoder for encoding at least one input set of N ordered permutation integers I(k), where k=1 to N, comprising:

a first encoder with memory size m, having a first input, coupled to a first source and a common source, and a multi-state register having $2^m$ states, for receiving said input bit set as said first source and encoding said input bit set to provide an encoded input bit set at a first output;

a hybrid S-random interleaver for receiving said input bit set and reordering the bits within said input bit set to provide a reordered input bit set, where S is an arbitrary predetermined value;

a second encoder with memory size m, having a second input, coupled to a second source and said common source, and a multi-state register having $2^m$ states, for receiving said reordered input bit set as said second source and encoding said reordered input bit set to provide a reordered encoded input bit set at a second output; and a switch, for switching said first encoder from said first source to said common source and for switching said second encoder from said second source to said common source; whereby said first output provides said common source;

whereby said interleaver reorders said integers such that once reordered, the value for $|I(k)-I(k-nL)|$ is not evenly divisible by L, where $L=2^m-1$, and n is a positive integer subject to $k-nL \geq 0$ and $nL \leq S$.

2. The encoder of claim 1 further comprising a tail bit generator for generating a set of tail bits for said encoded input bit set to reset both said registers.

3. The encoder of claim 2 wherein said tail bit generator generates said tail bit sets using the register of said first encoder when the encoding by said first and second encoders is complete.

4. The encoder of claim 1 wherein said interleaver randomly reorders the integers I(k) such that $|I(k)-I(k-j)|>S$ and j is a positive integer defined as $0<j \leq S$ and $k-j \geq 0$.

5. The encoder of claim 4, wherein the reordered integer I(k) sequence is verified with the following:

$k \bmod 2^m - 1 = I(k) \bmod 2^m - 1.$

6. The encoder of claim 1, whereby $d_k$ is an input bit of said set of N bits and where $d_k = \pm 1$, said interleaver further comprising:

means for arranging said input bit sets for an M state turbo code encoder into p disjoint subsets $S_i$, of size b, where p=M−1, i is an integer from 0 to (p−1), b is the smallest integer value larger than or equal to N/p and $S_i=\{d_k|,$ k mod p=i$\}$;

means for combining subsets $S_i$, to form a block of b rows and p columns where k is an integer from 1 to b such that each element of a subset is in the same column;

means for reordering the set of input bits within said columns; and means for outputting said rows after said column reordering to produce an interleaver reordered input bit set.

7. A transmitter having a turbo code encoder for encoding at least one input set of N ordered permutation integers I(k) prior to transmission, where k=1 to N, comprising:

a first encoder with memory size m, having a first input, coupled to a first source and a common source, and a multi-state register having $2^m$ states, for receiving said input bit set as said first source and encoding said input bit set to provide an encoded input bit set at a first output;

an S-random interleaver for receiving said input bit set and reordering the bits within said input bit set to provide a reordered input bit set, where S is an arbitrary predetermined value;

a second encoder with memory size m, having a second input, coupled to a second source and said common source, and a multi-state register having $2^m$ states, for receiving said reordered input bit set as said second source and encoding said reordered input bit set to provide a reordered encoded input bit set at a second output; and a switch, for switching said first encoder from said first source to said common source and for switching said second encoder from said second source to said common source; whereby said first output provides said common source;

whereby said interleaver reorders said integers such that once reordered, the value for |I(k)−I(k−nL) is not evenly divisible by L, where L=$2^m$−1, and n is a positive integer subject to k−nL≧0 and nL≦S.

8. The transmitter of claim 7, whereby the encoder further comprises a tail bit generator for generating a set of tail bits for said encoded input bit set to reset both said registers.

9. The transmitter of claim 8, wherein said tail bit generator generates said tail bit sets using the register of said first encoder when the encoding by said first and second encoders is complete.

10. The transmitter of claim 7, wherein said interleaver randomly reorders the integers I(k) for such that |I(k)−I(k−j)|>S and j is a positive integer defined as 0<j≦S and k−j≧0.

11. The transmitter of claim 10, wherein the reordered integer I(k) sequence is verified with the following:

$$k \bmod 2^m-1 = I(k) \bmod 2^m-1.$$

12. The transmitter of claim 7, where $d_k$ is an input bit of said set of N bits and $d_k=\pm 1$; and whereby said interleaver further comprises:

means for arranging said input bit sets for an M state turbo code encoder into p disjoint subsets $S_i$, of size b, where p=M−1, i is an integer from 0 to (p−1), b is the smallest integer value larger than or equal to N/p and $S_i=\{d_k|,$ k mod p=i$\}$;

means for combining subsets $S_i$, to form a block of b rows and p columns where k is an integer from 1 to b such that each element of a subset is in the same column;

means for reordering the set of input bits within said columns; and means for outputting said rows after said column reordering to produce an interleaver reordered input bit set.

13. A turbo code encoder for encoding at least one input set of N ordered permutation integers I(k), where k=1 to N, comprising:

a first encoder with memory size m, having a first input, coupled to a first source and a common source, and a multi-state register having $2^m$ states, for receiving said input bit set as said first source and encoding said input bit set to provide an encoded input bit set at a first output;

an interleaver for receiving said input bit set and reordering the bits within said input bit set to provide a reordered input bit set;

a second encoder with memory size m, having a second input, coupled to a second source and said common source, and a multi-state register having $2^m$ states, for receiving said reordered input bit set as said second source and encoding said reordered input bit set to provide a reordered encoded input bit set at a second output; and a switch, for switching said first encoder from said first source to said common source and for switching said second encoder from said second source to said common source; whereby said first output provides said common source;

whereby said interleaver reorders said integers such that once reordered, the value for |I(k)−I(k−nL)| is not evenly divisible by L, where L=$2^m$−1, n is a positive integer subject to k−nL≧0 and nL≦S, and S is an arbitrary predetermined value.

* * * * *

UNITED STATES PATENT AND TRADEMARK OFFICE
CERTIFICATE OF CORRECTION

PATENT NO. : 6,862,707 B2
DATED : March 1, 2005
INVENTOR(S) : Sung-Hyuk Shin

It is certified that error appears in the above-identified patent and that said Letters Patent is hereby corrected as shown below:

<u>Column 4,</u>
Line 65, Equation (7), delete "$n \cdot L \geq S$" and insert therefor -- $n \cdot L \leq S$ --.

Signed and Sealed this

Ninth Day of August, 2005

JON W. DUDAS
*Director of the United States Patent and Trademark Office*